US012614890B2

(12) United States Patent
Kovsh et al.

(10) Patent No.: US 12,614,890 B2
(45) Date of Patent: Apr. 28, 2026

(54) SEMICONDUCTOR OPTICAL AMPLIFIER WITH ENHANCED CHROMATIC DISPERSION

(71) Applicant: Arista Networks, Inc., Santa Clara, CA (US)

(72) Inventors: Alexey Kovsh, Saratoga, CA (US); David Towne, San Carlos, CA (US); Peter Parkinson, San Jose, CA (US)

(73) Assignee: ARISTA NETWORKS, INC., Santa Clara, CA (US)

( * ) Notice: Subject to any disclaimer, the term of this patent is extended or adjusted under 35 U.S.C. 154(b) by 1136 days.

(21) Appl. No.: 17/221,653

(22) Filed: Apr. 2, 2021

(65) Prior Publication Data

US 2022/0320821 A1 Oct. 6, 2022

(51) Int. Cl.
H01S 5/026 (2006.01)
H01S 5/12 (2021.01)
(Continued)

(52) U.S. Cl.
CPC ............... H01S 5/026 (2013.01); H01S 5/12 (2013.01); H01S 5/3412 (2013.01); H01S 5/343 (2013.01); H01S 5/4087 (2013.01); H04B 10/503 (2013.01)

(58) Field of Classification Search
CPC ........ H01S 5/026; H01S 5/50; H01S 2301/03; H01S 5/343
See application file for complete search history.

(56) References Cited

U.S. PATENT DOCUMENTS 6,404,944 B1 * 6/2002 Wa ......................... G02F 1/3133
385/9
6,751,013 B1 * 6/2004 Wu ..................... H04B 10/2914
359/344

(Continued)

FOREIGN PATENT DOCUMENTS

CN 107251241 A 10/2017
GB 2283858 A1 5/1995
(Continued)

OTHER PUBLICATIONS

Hui, Zhanqiang, et al. "Slot-slot waveguide with negative large and flat dispersion covering C+ L+ U waveband for on-chip photonic networks." Applied Optics 58.21 (2019): 5728-5739. (Year: 2019).*

(Continued)

*Primary Examiner* — Yuqing Xiao
*Assistant Examiner* — Zhengqing Qi
(74) *Attorney, Agent, or Firm* — Fountainhead Law Group, PC

(57) ABSTRACT

A semiconductor optical amplifier (SOA) receives a multi-wavelength input optical signal and amplifies the multi-wavelength input optical signal to generate an amplified multiwavelength optical signal. A waveguide is coupled to receive the amplified multiwavelength optical signal. The waveguide includes an enhanced chromatic dispersion segment configured to increase chromatic dispersion experienced by the multiwavelength optical signal as the multi-wavelength optical signal propagates through the waveguide and is amplified by the SOA. This increase in chromatic dispersion reduces noise, such as four-wave mixing noise, in the amplified multiwavelength optical signal.

20 Claims, 4 Drawing Sheets

(51) Int. Cl.

| | |
|---|---|
| *H01S 5/34* | (2006.01) |
| *H01S 5/343* | (2006.01) |
| *H01S 5/40* | (2006.01) |
| *H04B 10/50* | (2013.01) |

(56) References Cited

U.S. PATENT DOCUMENTS

| | | | | |
|---|---|---|---|---|
| 9,036,968 | B2 | 5/2015 | Gubenko et al. | |
| 2007/0091419 | A1* | 4/2007 | Akiyama | B82Y 20/00 |
| | | | | 359/344 |
| 2009/0202196 | A1* | 8/2009 | Kish, Jr. | G02B 6/124 |
| | | | | 385/14 |
| 2013/0315273 | A1* | 11/2013 | Kimoto | H01S 5/1039 |
| | | | | 372/50.121 |
| 2018/0026426 | A1* | 1/2018 | Kawakita | H01S 5/0687 |
| | | | | 372/20 |
| 2020/0343680 | A1* | 10/2020 | Lange | H04B 10/506 |
| 2021/0359493 | A1* | 11/2021 | Greif | H01S 5/3412 |
| 2022/0043202 | A1 | 2/2022 | Lachapelle et al. | |
| 2022/0320826 | A1 | 10/2022 | Kovsh et al. | |
| 2022/0376474 | A1 | 11/2022 | Chin et al. | |

FOREIGN PATENT DOCUMENTS

| | | | | |
|---|---|---|---|---|
| JP | | 2009099586 | A * | 5/2009 |
| JP | | 2010-003950 | A2 | 1/2010 |

OTHER PUBLICATIONS

Mas, Sara, et al. "Tailoring the dispersion behavior of silicon nanophotonic slot waveguides." Optics express 18.20 (2010): 20839-20844. (Year: 2010).*

Madsen, Christi K., et al. "Integrated all-pass filters for tunable dispersion and dispersion slope compensation." IEEE Photonics Technology Letters 11.12 (1999): 1623-1625. (Year: 1999).*

Liang, Di, and John E. Bowers. "Recent progress in heterogeneous III-V-on-silicon photonic integration." Light: Advanced Manufacturing 2.1 (2021): 59-83. (Year: 2021).*

Fujii, Takuro, et al. "Development of an Epitaxial Growth Technique using III-V on a Si Platform for Heterogeneous Integration of Membrane Photonic Devices on Si." Applied Sciences 11.4 (2021): 1801. (Year: 2021).*

Machine translation of JP-2009099586-A (Year: 2009).*

Runge et al., "Chromatic Dispersion in InGaAsP Semiconductor Optical Amplifiers," in IEEE Journal of Quantum Electronics, vol. 46, No. 5, pp. 644-649, May 2010. (Year: 2010).*

Bagnell et al., "Femtosecond dispersion measurements of 1.3 μm quantum dot semiconductor optical amplifier," CLEO/QELS: 2010 Laser Science to Photonic Applications, San Jose, CA, USA, 2010 (Year: 2010).*

Masoller, "Laser Models and Dynamics" accessed from "fisica.edu.uy/~cris/teaching/LSA_Masoller_part3.pdf" dated 2019 (Year: 2019).*

RP Photonics, "rp-photonics.com/kramers_kronig_relations.html" with Wayback Machine dated Jul. 31, 2016 (Year: 2016).*

M. N. Sysak, J. W. Raring, J. S. Barton, M. Dummer, D. J. Blumenthal and L. A. Coldren, "A single regrowth integration platform for photonic circuits incorporating tunable SGDBR lasers and quantum-well EAMs," in IEEE Photonics Technology Letters, vol. 18, No. 15, pp. 1630-1632, Aug. 2006. (Year: 2006).*

G. Zhao, G. Liu, C. Liu, Q. Lu and W. Guo, "Monolithically Integrated Directly Modulated ADR-DFB Laser Array in the O-Band," in IEEE Photonics Technology Letters, vol. 31, No. 18, pp. 1495-1498, 15 Sep. 15, 2019. (Year: 2019).*

Arashmehr, Armin and Zavvari, Mahdi. "Chirp Parameter in Strained Coupled Quantum Well Electroabsorption Modulators" Journal of Optical Communications, vol. 35, No. 4, 2014, pp. 263-267. (Year: 2014).*

V. Chakraborty et al., "Performance prediction of an electroabsorption modulator at 1550nm using GeSn/SiGeSn Quantum Well structure," Physica E: Low-dimensional Systems and Nanostructures, vol. 50, pp. 67-72 (2013). (Year: 2013).*

Anna Tauke-Pedretti, Matthew M. Dummer, Matthew N. Sysak, Jonathon S. Barton, Jonathan Klamkin, James W. Raring, and Larry A. Coldren, "Separate Absorption and Modulation Mach-Zehnder Wavelength Converter," J. Lightwave Technol. 26, 91-98 (2008). (Year: 2008).*

R. Bonk et al., "The Input Power Dynamic Range of a Semiconductor Optical Amplifier and Its Relevance for Access Network Applications," in IEEE Photonics Journal, vol. 3, No. 6, pp. 1039-1053, Dec. 2011. (Year: 2011).*

G. Contestabile, A. Maruta, S. Sekiguchi, K. Morito, M. Sugawara and K. Kitayama, "80 GB/s multicast wavelength conversion by XGM in a QD-SOA," 36th European Conference and Exhibition on Optical Communication, Turin, Italy, 2010, pp. 1-3. (Year: 2010).*

Motoharu Matsuura, Nicola Calabretta, Oded Raz, and Harm J. S. Dorren, "Multichannel wavelength conversion of 50-Gbit/s NRZ-DQPSK signals using a quantum-dot semiconductor optical amplifier," Opt. Express 19, B560-B566 (2011). (Year: 2011).*

* cited by examiner

SEMICONDUCTOR OPTICAL AMPLIFIER WITH ENHANCED CHROMATIC DISPERSION

BACKGROUND

The present disclosure relates generally to optical communications.

An important application of optical communication is in computer networks connecting servers and storage systems in large data centers. For example, the majority of all network traffic today is generated by servers inside of large Cloud Data Centers that are connected to each other and to the Internet with high-speed network switches in these data centers. The throughput of these network switches and optical links interconnecting continues to grow at a significant rate with the next generations of network switch chips providing throughput of 51.2 Tbps (Terabits per second).

One problem with today's high-speed optical links is power and reliability. Network switch chips, for example, require a large number of lasers for communications over optical links and these lasers have high current densities, which reduces the expected lifetime of the lasers and thereby the meantime between failure of optical communications modules including the lasers. As new designs for these optical links are implemented to improve performance of the links, additional photonic or optical components may be added to the links as part of these new designs. The addition of any active photonic components in an optical link, however, results in an introduction of additional noise into the link, which may negatively affect performance of the link such as through the degradation of the bit error rate (BER) and other operating parameters of the link.

New designs or architectures of optical links have considered the inclusion of semiconductor optical amplifiers (SOAs) for amplifying multiple wavelengths $\lambda$ of light being communicated through the link. Non-linear effects present in SOAs introduce noise into the optical link, however, which may degrade performance. The utilization of SOAs in these new optical link architectures may thereby be limited or even precluded in some designs due to these non-linear effects and the resultant noise introduced into the link. For example, the performance of current SOAs limits the utilization of an SOA in an optical link requiring amplification of several lanes of different wavelengths $\lambda$ of light without the generation of noise that is prohibitive to proper operation of the link. An optical link utilizing 100 Gigabit (100 G) pulse amplitude modulation (PAM), such as four level PAM (PAM4) modulation, is an example of such an optical link, with the PAM4 modulation format being much more sensitive to noise compared to other modulation formats like the non-return-to-zero (NRZ) format. Improved SOAs having reduced noise characteristics are accordingly needed.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions.

DETAILED DESCRIPTION

Described herein are techniques for silicon optical amplifier (SOAs) and optical transmitters and optical communication systems including SOAs as booster amplifiers. In the following description, for purposes of explanation, numerous examples and specific details are set forth in order to provide a thorough understanding of some embodiments. Some embodiments as defined by the claims may include some or all of the features in these examples alone or in combination with other features described below and may further include modifications and equivalents of the features and concepts described herein.

Figure 1:
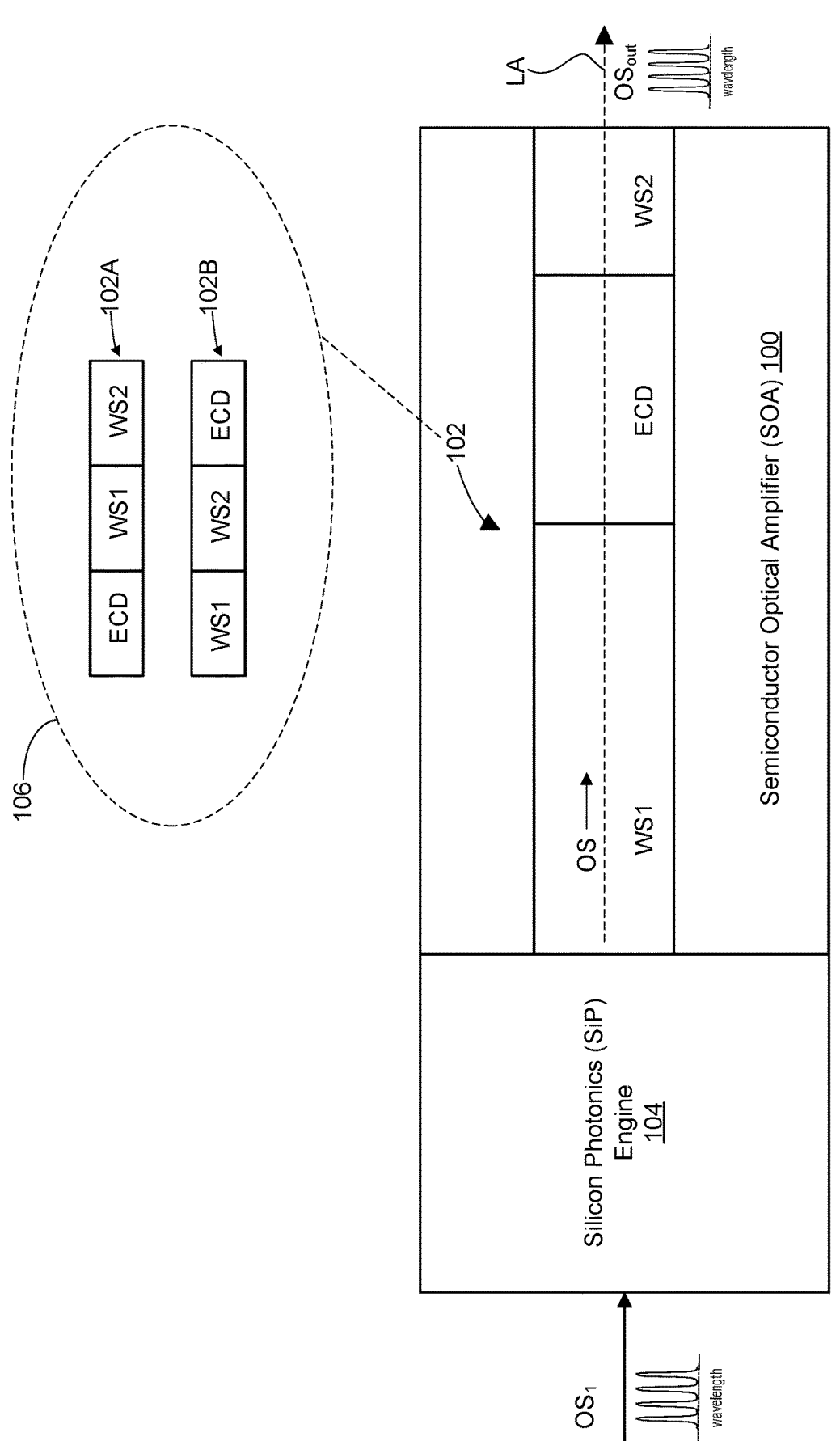
FIG. 1 is top view of silicon photonics (SiP) engine and an SOA including a waveguide having an enhanced chromatic dispersion segment according to one embodiment of the present disclosure.

FIG. 1 is a schematic top view of an SOA 100 including a waveguide 102 having an enhanced chromatic dispersion (ECD) segment that increases the chromatic dispersion experienced by an optical signal OS including multiple signals having different wavelengths $\lambda$ according to one embodiment of the present disclosure. Because the ECD segment of the waveguide 102 has an increased chromatic dispersion, the effect of the multiple signals of different wavelengths $\lambda$ contained in the OS signal traveling through the ECD segment results in a reduction in noise or distortion in the OS signal that may be generated due to nonlinear interactions between these different wavelength signals, as will be described in more detail below. In FIG. 1, a silicon photonics (SiP) engine 104 includes integrated silicon optical components that receive an input optical signal $OS_1$ having multiple wavelengths $\lambda$ and modulates the multiple wavelengths. The SOA 100 performs the amplification function, and accordingly amplifies the modulated $OS_1$ signal to generate an amplified optical signal $OS_{out}$. The waveguide 102 further includes a first waveguide segment WS1 coupled to the SiP engine 104 to receive the modulated optical signal $OS_1$. The waveguide segment WS1 is coupled between the SiP engine 104 and the ECD segment and the waveguide 102 further includes a second waveguide segment WS2 coupled between the ECD segment and an output of the waveguide.

In operation, the SiP engine 104 receives the multiwavelength input optical signal $OS_1$, with the signals at different wavelengths $\lambda$ contained in the input optical signal and modulates the wavelengths to include information being communicated. The SOA 100 amplifies the modulated input optical signal $OS_1$, which is supplied to the waveguide 102 and propagates through the waveguide 102 from left-to-right as indicated by the arrow for an optical signal OS in FIG. 1. The optical signal OS propagates first through the waveguide segment WS1, and then through the ECD segment having increased chromatic dispersion that increases the chromatic dispersion experienced by the signals of different wavelengths λ contained in the OS signal. The optical signal OS propagates in a direction parallel to a longitudinal axis LA of the waveguide 102, which may be described herein as the optical signal propagating along the longitudinal axis LA through the waveguide. From the ECD segment the optical signal OS propagates along the longitudinal axis LA through the second waveguide segment WS2 of the waveguide 102 and is output from the SOA 100 as an output optical signal $OS_{out}$. Each of the input optical signal $OS_1$ and output optical signal $OS_{out}$ includes a plurality of signals at different wavelengths λ and thus may referred to as a multiwavelength optical signal in the present description, and may also in some embodiments be referred to as a wavelength division multiplexing (WDM) signal, or a coarse WDM (CWDM) or dense WDM (DWDM) signal in the present description.

The structure of the SOA 100 varies in different embodiments. For example, the SOA 100 includes a semiconductor-based gain medium that may include quantum wells so that the SOA 100 is a quantum well SOA. The quantum wells may be InGaAs/InP quantum wells. In another embodiment, the gain medium of the SOA 100 may include quantum dots so that the SOA 100 is a quantum dot SOA, where these quantum dots may be InGaAs/GaAs quantum dots. The SOA 100 may be formed from additional suitable structures, as will be understood by those skilled in the art. In the SOA 100, the waveguide 102 may be formed from a suitable material or materials as one or more layers in a semiconductor structure including a plurality of layers, as will be described in more detail below with reference to FIG. 2.

In general, various types of noise may be generated by SOAs and thus may be present in the generated output optical signal $OS_{out}$. These types of noise arise due to non-linear effects during operation of the SOA and contribute to increasing the bit error rate (BER), as mentioned above. Types of noise generated in SOAs include self-gain modulation (SGM), cross-gain modulation (CGM), four-wave mixing (FWM), cross-phase modulation (XPM), and self-phase module (SPM). The specific structure of the SOA will result in more or less generation of these different types of noise in the SOA. For example, where the structure of the SOA includes quantum wells or quantum dots, most of the types of noise mentioned above are reduced compared to other structures for the SOA. This is true for the types of noise mentioned above, namely SGM, CGM, XPM, and SPM, but is not true for the FWM type of noise. Thus, while utilizing quantum wells or quantum dots as a gain medium to form the structure of the SOA 100 has the advantage of reducing most types of noise generated in the SOA, FWM noise may still preclude utilizing an SOA in an optical link architecture in which the SOA is to amplify a multiple wavelength optical signal.

FWM is a third-order non-linear effect that is caused by dependence of the refractive index of a waveguide on an intensity of the power of an optical signal propagating through the waveguide. FWM is generated from the interactions of two or three wavelengths of optical signals propagating through the waveguide, with these interactions generating an additional one or two wavelengths of optical signals propagating through the waveguide. These additional generated one or two wavelengths of optical signals are unwanted signals generated in the waveguide and are accordingly noise. Moreover, these generated noise signals may, in some applications, interfere with the original optical signals having different wavelengths λ that are desired to be propagated through the waveguide. Where the optical signal to be propagated through the waveguide is a coarse wavelength division multiplexing (CWDM) signal, such as a CWDM signal having 10-20 nm wavelength spacing, the FWM noise may not present a noise problem. Conversely, where the optical signal to be propagated through the waveguide is a dense wavelength division multiplexing (D WDM) signal, such as a DWDM signal having 0.4-0.8 nm wavelength spacing, the FWM noise may result in noise that interferes with the desired optical signal to be propagated and unacceptably increases the bit error rate (BER) of this signal.

From this discussion of FWM noise in SOAs, it is seen that FWM noise may prevent an SOA from being utilized in DWDM optical links to amplify DWDM signals including multiple optical signals having multiple densely spaced wavelengths λ. Referring again to FIG. 1, the structure of the SOA 100 reduces FWM noise due to the inclusion of the enhanced chromatic dispersion (ECD) segment in the waveguide 102 of the SOA. This reduced FWM noise in the SOA 100 allows the SOA to be utilized to amplify DWDM signals in optical links without introducing an unacceptable level of FWM noise into the amplified DWDM signal. Chromatic dispersion, which may be viewed as the dependence of refractive index of the waveguide 102 on the wavelengths λ of the optical signal OS, effects the FWM noise generated in the waveguide 102. The greater the dispersion experienced by the multiple wavelengths λ in the optical signal OS, the lower will be the FWM noise generated by the SOA 100.

The chromatic dispersion of the waveguide 102 is a phenomenon in which the phase velocity of the optical signal OS propagating through the waveguide is a function of the frequency or wavelength of the optical signal. Thus, because the optical signal OS has multiple wavelengths λ, each signal at a given wavelength that is contained in the optical signal will propagate through the waveguide 102 at a different phase velocity. Phase velocity is the speed at which an optical signal propagates through the waveguide 102 and is accordingly different for the different wavelengths λ of signals forming the optical signal OS. Increasing the dispersion experienced by the optical signal OS including multiple wavelengths λ through the inclusion of the ECD segment in the waveguide 102 will reduce the interaction or intermodulation of the signals of multiple wavelengths λ contained in the OS signal and thereby reduce the FWM noise generate by the SOA 100. This improves the BER of the output optical signal $OS_{out}$ and enables the SOA 100 to be utilized in applications requiring the amplification of DWDM signals or other optical signals including multiple wavelengths λ. In the SOA 100, the ECD segment has increased chromatic dispersion relative to the other segments WS1, WS2 of the waveguide 100. The structure of the ECD segment, including the materials used to form the segment and the length of the segment along the longitudinal axis LA, are selected to provide the required chromatic dispersion to reduce the FWM noise generated by the SOA 100.

In the embodiment of FIG. 1, the waveguide 102 includes the ECD segment positioned between the first and second waveguide segments WS1 and WS2. The ECD segment may, however, be located anywhere along the longitudinal length LA of the waveguide 100 in further embodiments. For example, further embodiments of the waveguide 102 are illustrated through the inset 106 shown in the upper right portion of FIG. 1. As seen in the inset 106, the ECD segment may be positioned on the far left of the waveguide as seen in a waveguide 102A shown in the inset. In another embodiment, the ECD segment is positioned on the far right of the waveguide as seen in the waveguide 102B shown in the inset 106. In the waveguides 102A, 102B, the first and second waveguide segments WS1, WS2 are shown as distinct portions simply for comparison of these embodiments to the embodiment of the waveguide 102 in the main portion of FIG. 1. Thus, although separately labeled, the coupled segments WS1, WS2 may be considered a single segment or portion in each of the waveguides 102A, 102B since each of these segments has the same structure and characteristics. In some embodiments, the ECD segment may be along the entirety of the waveguide 102, having no waveguide segments WS1 and WS2.

Figure 2:
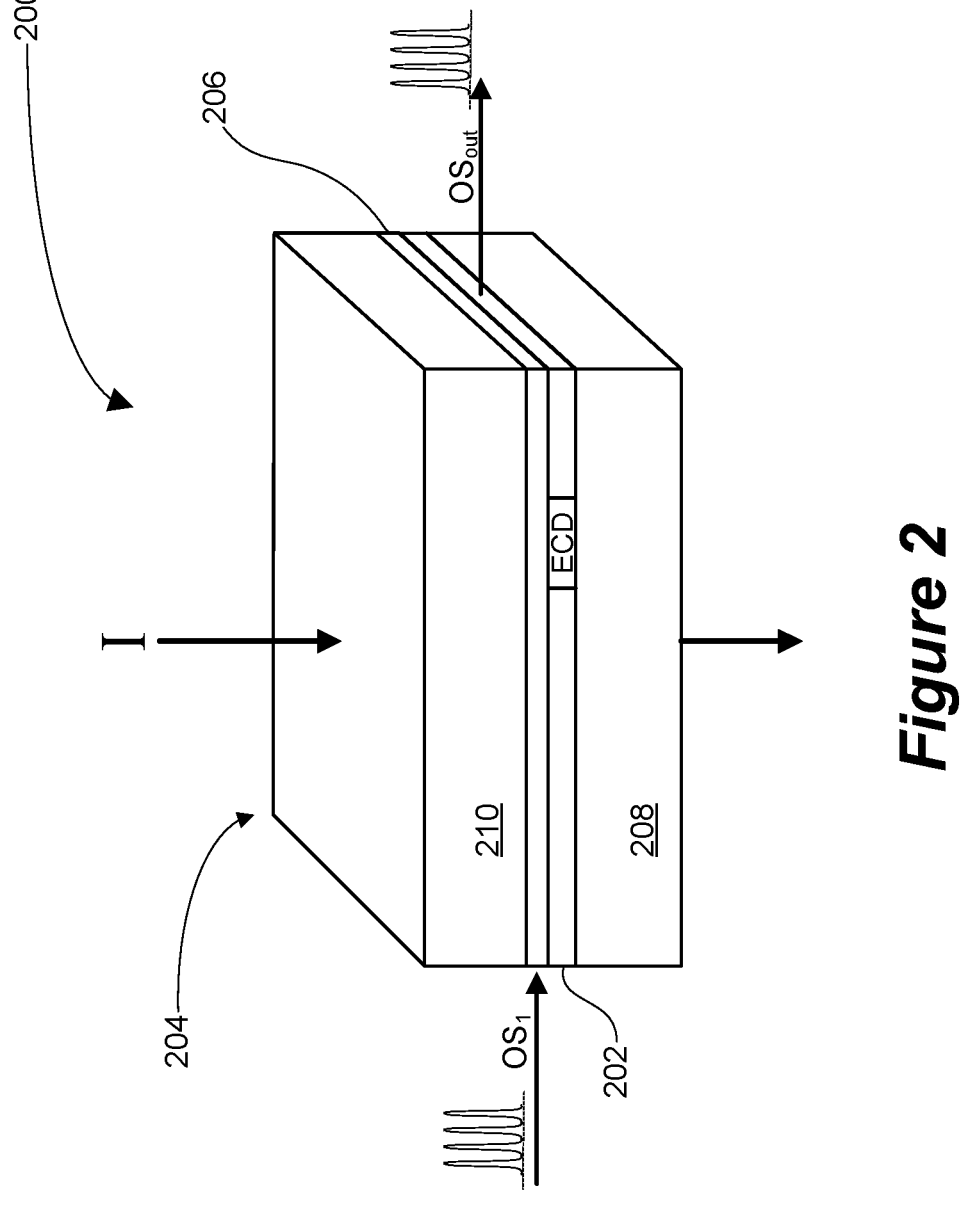
FIG. 2 is a perspective view illustrating a simplified physical structure of an SOA including an integrated waveguide having an enhanced chromatic dispersion segment according to an embodiment.

FIG. 2 is a perspective view illustrating a simplified physical structure of an SOA 200 including an integrated waveguide 202 having an enhanced chromatic dispersion (ECD) segment according to an embodiment. As will be understood by those skilled in the art, an SOA is an optical device based on a semiconductor-based gain material or medium, and includes structure formed by a plurality of layers 204 in a semiconductor layered structure. In the example embodiment of FIG. 2, the SOA 200 includes an active layer 206 that receives a current I to amplify a received optical input signal $OS_1$ including multiple wavelengths $\lambda$ as this signal propagates through the active region. The SOA 200 has a structure that couples the active layer 206 to the waveguide 202. The optical signal OS is amplified as it propagates through the waveguide 202 including the ECD segment and is provided as an output optical signal $OS_{out}$ from the SOA 200. The ECD segment of the waveguide 202 has an increased chromatic dispersion and, as described above in relation the ECD segment of FIG. 1, the effect of this dispersive segment on the multiple signals of different wavelengths $\lambda$ contained in the OS signal traveling through the ECD segment results in reduced noise, such as four-wave mixing, in the OS signal that may be generated due to nonlinear interactions between these different wavelength signals in the OS signal.

In the example embodiment of FIG. 2, the SOA 200 further includes a first cladding layer 208 over which the active layer 206 is formed and a second cladding layer 210 formed over the active layer 206. One of the cladding layers 208, 210 would typically be an N-type material and the other would be a P-type material. The current I supplied to the active layer 206 flows vertically through the cladding layers 210, 208 as indicated by the arrows in FIG. 2. The waveguide 202 is formed in a layer between the first cladding layer 208 and the active layer 206 in this example embodiment. FIG. 2 is one example of a physical structure of an SOA 200 including an integrated waveguide 202 with an ECD segment. The SOA 200 has other suitable structures in further embodiments of the present disclosure. For example, the SOA 200 including the active layer 206 and cladding layers 208, 210 may have different structures in further embodiments of the SOA 200. The gain structure of the SOA 200 may, for example, include quantum dots or quantum wells in further embodiments of the SOA 200, as mentioned above in relation to the SOA 100 of FIG. 1. Although shown as being a separate component from the active layer 206, in embodiments the waveguide 202 may be formed in or correspond to the active layer.

In the SOA 200, the waveguide 202 may be formed from one or more layers of a suitable material. In addition, the formation of the ECD segment 202A may be formed by any suitable method when fabricating the SOA 200. The ECD segment 202A may, for example, be formed through ion implantation of a suitable dopant material into a layer of semiconductor material in which the waveguide 202 is being formed. Other methods such as intermixing or diffusion of a suitable dopant into a layer of semiconductor material forming other segments of the waveguide 202 may also be utilized to form the ECD segment 202A. The SOA 200 may be formed through any suitable processes for forming silicon photonic devices, as will be understood by those skilled in the art.

Figure 3:
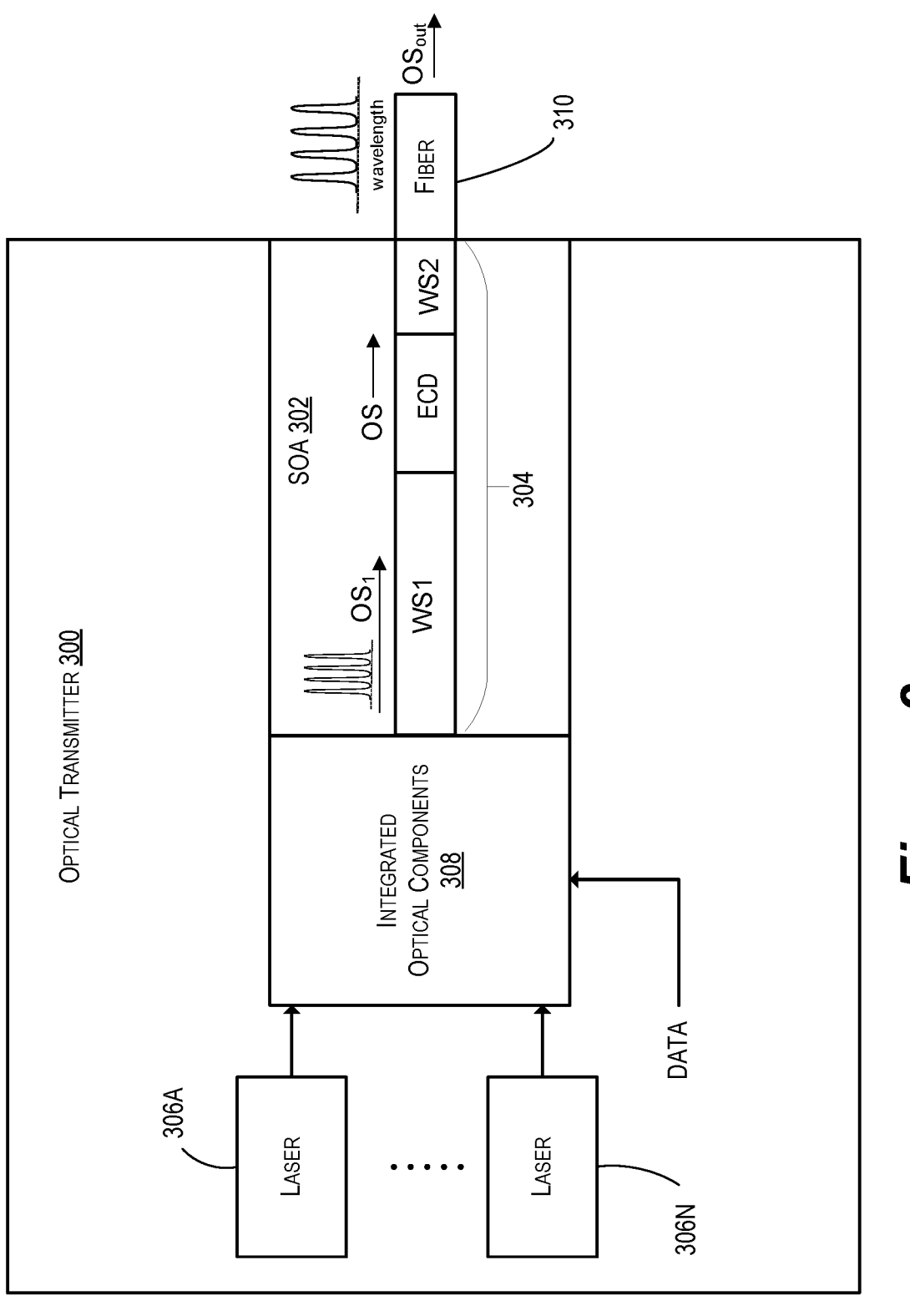
FIG. 3 is a functional block diagram of an optical transmitter including an SOA with an enhanced chromatic dispersion segment for amplifying multiple wavelengths of light according to another embodiment.

FIG. 3 is a functional block diagram of an optical transmitter 300 including an SOA 302 with a waveguide 304 having an enhanced chromatic dispersion (ECD) segment for generating and amplifying an optical signal OS including multiple signals of different wavelengths $\lambda$, such as a DWDM signal, according to another embodiment. The SOA 302 may correspond to any of the SOAs 100, 200 as described above with reference to FIGS. 1 and 2. The optical transmitter 300 includes a plurality of lasers 306A-N that may each generate optical signals having different wavelengths $\lambda$. The optical signals having different wavelengths $\lambda$ are coupled to integrated silicon optical components 308 (Silicon Photonics, SiP), which may include multiplexers for combining the different wavelength optical signals and modulators for modulating the optical signals generated by lasers 306A-N based on electrically encoded data (DATA) to be transmitted. In this example, each laser 306A-N generates an optical signal having a given wavelength $\lambda$, and a modulated optical signal $OS_1$ having a plurality of wavelengths $\lambda$ is accordingly output from the integrated optical components 308 and provided as the input optical signal to the SOA 302.

In one embodiment of the optical transmitter 300, the integrated optical components 308 may be coupled to the SOA 302 using polymer-based optical waveguides, which may be formed on printed circuit boards, for example. This coupling of the integrated optical components 308 establishes an optical link from the lasers 306A-N to an input of the SOA 302. An output of the SOA 302 is coupled from the waveguide 304 to a fiber optic cable 310. A suitable connector may be interposed between an output facet of the waveguide 304 and the fiber optic cable 310 to couple these components to one another.

In one embodiment, the structure of the SOA 302 may include a semiconductor-based gain medium including quantum wells so that the SOA is a quantum well SOA, where these quantum wells may be InGaAs/InP quantum wells. In another embodiment, the semiconductor-based gain medium of the SOA 302 may include quantum dots so that the SOA is a quantum dot SOA, where these quantum dots may be InGaAs/GaAs quantum dots. In embodiments, the lasers 306A-N are continuous lasers and each of these lasers may be continuous wave distributed feedback laser in embodiments. In some embodiments, the lasers 306A-N are a quantum dot comb laser that generates a plurality of optical signals at different wavelengths. In embodiments, the wavelengths of the optical signals from the lasers 306A-N are around 1.3 um.

The SOA 302 including the waveguide 304 with the ECD segment enables the optical transmitter 300 having the architecture illustrated in FIG. 3 to be utilized in DWDM optical links. The architecture of the optical transmitter 300 also improves the reliability of the optical transmitter by allowing lower power lasers 306A-N to be utilized. The required power of the lasers 306A-N is reduced with the architecture of the optical transmitter 300 because each of these lasers may generate an optical signal at a relatively low power level, with the SOA 302 thereafter amplifying these optical signal to increase their power in accordance with the power requirements of the optical link including the fiber optic cable 312. Reducing the power of the optical signals that must be generated by the lasers 306A-N improves the reliability or lifetime of these lasers (i.e., lower power lasers have a longer MTBF than do higher power lasers), which thereby improves the overall reliability of the optical transmitter 300.

The SOA 302 provides amplification of several lasing lanes, which correspond to the optical signals at different wavelengths λ generated by the lasers 306A-N, without generation of as much noise, which would typically be in the form of FWM noise, that may be prohibitive in certain modulation schemes, such as the 100 G PAM4 modulation format. Where the SOA 302 has a quantum dot structure, the FWM noise generated in the SOA may be the primary noise of concern in modulation schemes such as 100 G PAM4, and this reduction of FWM noise advantageously allows the use of SOA to amplify multiwavelength optical signals in optical links implementing these modulation schemes.

Figure 4:
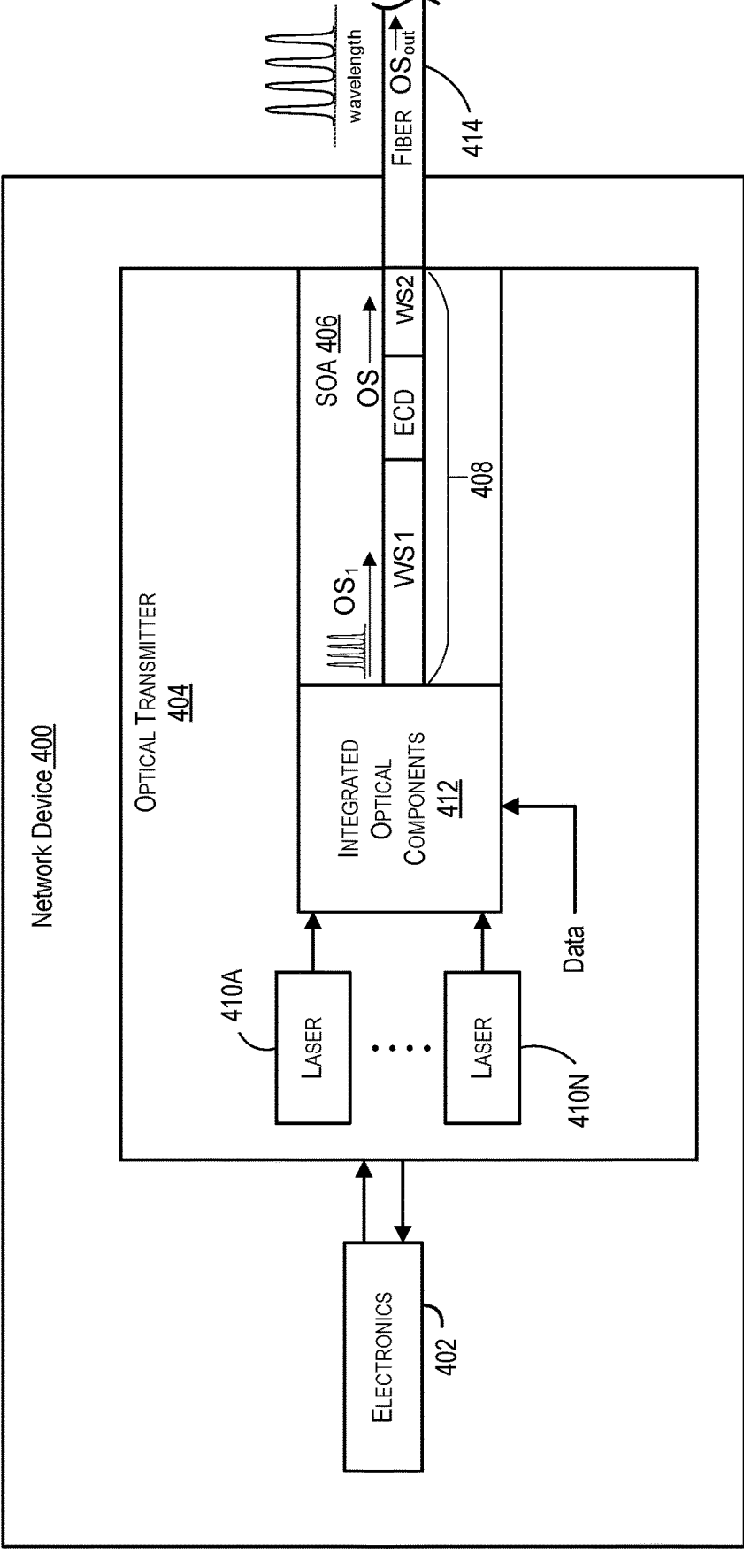
FIG. 4 is a functional block diagram of a network device including an optical transmitter containing an SOA with an enhanced chromatic dispersion segment for amplifying multiple wavelengths of light according to a further embodiment.

FIG. 4 is a functional block diagram of a network device 400 including electronic circuitry or electronics 402 coupled to an optical transmitter 404 containing a SOA 406 including a waveguide 408 including an ECD segment according to an embodiment of the present disclosure. In this example embodiment, the optical transmitter 404 includes one or more lasers 410A-N and integrated optical components 412, which may be, for example, a silicon photonics chip. The integrated optical components 412 are coupled to the SOA 406 to establish an optical link from lasers 410A-N to an input of the SOA 406. An amplified optical signal OS$_{out}$ output from the SOA 406 is coupled to a fiber optic cable 414. The electronics 402 may be, for example, network switch or network router circuitry, and may include suitable modulation circuitry. For example, the electronics 402 may include modulation circuitry for implementing 100 G PAM4 modulation, non-direct modulation schemes such as electro-absorption modulation, Non-Return-to-Zero (NRZ) modulation, other type of Pulse-Amplitude Modulation (PAM), and Quadrature Amplitude Modulation (QAM) with coherent detection.

Further Examples

In various embodiments, the present disclosure includes systems, methods, and apparatuses for optical communications.

In one embodiment, the present disclosure includes a semiconductor optical amplifier (SOA), comprises: a semiconductor-based gain medium configured to receive a multiwavelength input optical signal and to amplify the multiwavelength input optical signal to generate an amplified multiwavelength optical signal; and a waveguide in the semiconductor-based gain medium, the waveguide including an enhanced chromatic dispersion segment configured such that the multiwavelength optical signal experiences increased chromatic dispersion as the multiwavelength optical signal is amplified as it propagates through the waveguide.

In an embodiment, the semiconductor-based gain medium comprises quantum wells.

In an embodiment of the semiconductor optical amplifier, the quantum wells comprise InGaAs/InP quantum wells.

In an embodiment of the semiconductor optical amplifier, the semiconductor-based gain medium comprises quantum dots.

In an embodiment of the semiconductor optical amplifier, the quantum dots comprise InGaAs/GaAs quantum dots.

In an embodiment of the semiconductor optical amplifier, the waveguide comprises a layer of semiconductor material and the enhanced chromatic dispersion segment comprises a doped region in this semiconductor layer.

In an embodiment of the semiconductor optical amplifier, the multiwavelength input optical signal and the amplified multiwavelength optical signal are 100 G PAM4 modulated signals.

In an embodiment of the semiconductor optical amplifier, the waveguide comprises the enhanced chromatic dispersion segment and a plurality of additional waveguide segments.

In another embodiment, an optical transmitter, comprises: a plurality of lasers configured to produce respective optical signals, each optical signal having a wavelength; optical components coupled to the plurality of lasers and configured to output a multiwavelength optical signal; and a semiconductor optical amplifier coupled to the optical components to receive the multiwavelength optical signal from the optical components and to amplify the multiwavelength optical signal to generate an amplified multiwavelength optical signal, the semiconductor optical amplifier including: a waveguide having an enhanced chromatic dispersion segment configured to increase chromatic dispersion experienced by the multiwavelength optical signal as it propagates and is amplified in the semiconductor optical amplifier to thereby reduce four-wave mixing noise in the amplified multiwavelength optical signal.

In an embodiment of the optical transmitter, the plurality of lasers comprise continuous wave distributed feedback lasers.

In an embodiment of the optical transmitter, the plurality of lasers comprise a quantum dot comb laser generating a plurality of different wavelength optical signal.

In an embodiment of the optical transmitter, the wavelengths of the optical signals from the plurality of lasers are around 1.3 um.

In an embodiment of the optical transmitter, the semiconductor optical amplifier comprises quantum wells.

In an embodiment of the optical transmitter, the quantum wells comprise InGaAs/InP quantum wells.

In an embodiment of the optical transmitter, the semiconductor optical amplifier comprises quantum dots.

In an embodiment of the optical transmitter, the quantum dots comprise InGaAs/GaAs quantum dots.

In an embodiment of the optical transmitter, the waveguide comprises a layer of semiconductor material and the enhanced chromatic dispersion segment comprises a doped region in this semiconductor layer.

In another embodiment, a network device, comprises: electronic circuitry; and an optical transmitter coupled to the electronic circuitry, the optical transmitter including: a plurality of lasers configured to produce respective optical signals, each optical signal having a wavelength; optical components coupled to the plurality of lasers and configured to output a multiwavelength optical signal; and a semiconductor optical amplifier coupled to the optical components to receive the multiwavelength optical signal from the optical components and to amplify the multiwavelength optical signal to generate an amplified multiwavelength optical signal, the semiconductor optical amplifier including a waveguide having an enhanced chromatic dispersion segment configured to increase chromatic dispersion experienced by the multiwavelength optical signal as it propagates and is amplified in the semiconductor optical amplifier to thereby reduce four-wave mixing noise in the amplified multiwavelength optical signal.

In an embodiment of the network device, the network device comprises a network switch.

In an embodiment of the network device, the waveguide comprises a layer of semiconductor material and the enhanced chromatic dispersion segment comprises a doped region in this semiconductor layer.

What is claimed is:

1. A semiconductor optical amplifier in a network device, comprising:

a first cladding layer;

a semiconductor-based gain medium disposed adjacent the first cladding layer; and a second cladding layer disposed adjacent the semiconductor-based gain medium, the semiconductor-based gain medium configured to receive a multiwavelength input optical signal and to amplify the multiwavelength input optical signal to generate an amplified multiwavelength optical signal, the semiconductor-based gain medium comprising:

an active layer disposed adjacent the first cladding layer; and a waveguide layer disposed between the active layer and the second cladding layer, wherein the active layer receives a current to amplify the multiwavelength input optical signal that propagates through the waveguide layer, the waveguide layer comprising a first region, a second region, and a single enhanced chromatic dispersion region disposed between the first and second regions, the enhanced chromatic dispersion region in the waveguide layer having a chromatic dispersion property that is greater than a chromatic dispersion property of the first and second regions, wherein the first and second regions exhibit a same level of chromatic dispersion, wherein light propagating through the waveguide layer experiences chromatic dispersion in the first region, followed by chromatic dispersion in the enhanced chromatic dispersion region greater than in the first region, followed by chromatic dispersion in the second region less than in the enhanced chromatic dispersion region.

2. The semiconductor optical amplifier of claim 1, wherein the semiconductor-based gain medium comprises quantum wells.

3. The semiconductor optical amplifier of claim 2, wherein the quantum wells comprise InGaAs/InP quantum wells.

4. The semiconductor optical amplifier of claim 1, wherein the semiconductor-based gain medium comprises quantum dots.

5. The semiconductor optical amplifier of claim 4, wherein the quantum dots comprise InGaAs/GaAs quantum dots.

6. The semiconductor optical amplifier of claim 1, wherein the waveguide layer comprises a layer of semiconductor material, and the enhanced chromatic dispersion region comprises a doped region in the layer of semiconductor material.

7. The semiconductor optical amplifier of claim 1, wherein the multiwavelength input optical signal and the amplified multiwavelength optical signal are 100 G PAM4 modulated signals.

8. The semiconductor optical amplifier of claim 1, wherein the waveguide layer comprises the enhanced chromatic dispersion region and a plurality of additional waveguide segments.

9. An optical transmitter, comprising:

a plurality of lasers configured to produce respective optical signals, each optical signal having a wavelength;

optical components coupled to the plurality of lasers and configured to output a multiwavelength optical signal; and a semiconductor optical amplifier coupled to the optical components and comprising:

a first cladding layer;

a semiconductor-based gain medium disposed adjacent the first cladding layer; and a second cladding layer disposed adjacent the semiconductor-based gain medium, the semiconductor-based gain medium configured to receive a multiwavelength input optical signal and to amplify the multiwavelength input optical signal to generate an amplified multiwavelength optical signal, the semiconductor-based gain medium comprising:

an active layer disposed adjacent the first cladding layer; and a waveguide layer disposed between the active layer and the second cladding layer, wherein the active layer receives a current to amplify the multiwavelength input optical signal that propagates through the waveguide layer, the waveguide layer having an enhanced chromatic dispersion region disposed between a first region and a second region, the enhanced chromatic dispersion region in the waveguide layer having a chromatic dispersion property that is greater than a chromatic dispersion property in both the first region and the second region.

10. The optical transmitter of claim 9, wherein the plurality of lasers comprise continuous wave distributed feedback lasers.

11. The optical transmitter of claim 10, wherein the plurality of lasers comprise a quantum dot comb laser generating a plurality of different wavelength optical signal.

12. The optical transmitter of claim 9, wherein the wavelengths of the optical signals from the plurality of lasers are around 1.3 um.

13. The optical transmitter of claim 9, wherein the semiconductor optical amplifier comprises quantum wells.

14. The optical transmitter of claim 13, wherein the quantum wells comprise InGaAs/InP quantum wells.

15. The optical transmitter of claim 9, wherein the semiconductor optical amplifier comprises quantum dots.

16. The optical transmitter of claim 15, wherein the quantum dots comprise InGaAs/GaAs quantum dots.

17. The optical transmitter of claim 9, wherein the waveguide layer comprises a layer of semiconductor material, and the enhanced chromatic dispersion region comprises a doped region in the layer of semiconductor material.

18. A network device, comprising:

electronic circuitry; and an optical transmitter coupled to the electronic circuitry, the optical transmitter including:

a plurality of lasers configured to produce respective optical signals, each optical signal having a wavelength;

optical components coupled to the plurality of lasers and configured to output a multiwavelength optical signal; and a semiconductor optical amplifier coupled to the optical components and comprising:

a first cladding layer;

a semiconductor-based gain medium disposed adjacent the first cladding layer; and a second cladding layer disposed adjacent the semiconductor-based gain medium, the semiconductor-based gain medium configured to receive a multiwavelength input optical signal and to amplify the multiwavelength input optical signal to generate an amplified multiwavelength optical signal, the semiconductor-based gain medium comprising:

an active layer disposed adjacent the first cladding layer; and a waveguide layer disposed between the active layer and the second cladding layer, wherein the active layer receives a current to amplify the multiwavelength input optical signal that propagates through the waveguide layer, the waveguide layer having an enhanced chromatic dispersion region disposed between a first region and a second region, the enhanced chromatic dispersion region in the waveguide layer having a chromatic dispersion property that is greater than a chromatic dispersion property in both the first region and the second region, wherein light propagating through the waveguide layer experiences chromatic dispersion in the first region, followed by chromatic dispersion in the enhanced chromatic dispersion region greater than in the first region, followed by chromatic dispersion in the second region less than in the enhanced chromatic dispersion region.

19. The network device of claim 18, wherein the network device comprises a network switch.

20. The network device of claim 18, wherein the waveguide layer comprises a layer of semiconductor material, and the enhanced chromatic dispersion region comprises a doped region in the layer of semiconductor material.

* * * * *